US008115319B2

(12) United States Patent
Hsu et al.

(10) Patent No.: US 8,115,319 B2

(45) Date of Patent: Feb. 14, 2012

(54) FLIP CHIP PACKAGE MAINTAINING ALIGNMENT DURING SOLDERING

(75) Inventors: Hung-Hsin Hsu, Hsinchu (TW); Chih-Ming Ko, Hsinchu (TW)

(73) Assignee: Powertech Technology Inc., Hukou Shiang, Hsinchu (TW)

( * ) Notice: Subject to any disclaimer, the term of this patent is extended or adjusted under 35 U.S.C. 154(b) by 161 days.

(21) Appl. No.: 12/717,518

(22) Filed: Mar. 4, 2010

(65) Prior Publication Data

US 2011/0215466 A1 Sep. 8, 2011

(51) Int. Cl.
*H01L 23/498* (2006.01)

(52) U.S. Cl. ................. 257/778; 257/737; 257/E23.068

(58) Field of Classification Search .................. 257/737, 257/778, E23.068, 738

See application file for complete search history.

(56) References Cited

U.S. PATENT DOCUMENTS

| | | | | |
|---|---|---|---|---|
| 4,878,611 | A * | 11/1989 | LoVasco et al. | 228/180.22 |
| 6,229,220 | B1 | 5/2001 | Saitoh et al. | |
| 6,509,256 | B2 * | 1/2003 | Medlen et al. | 438/618 |
| 6,643,434 | B2 * | 11/2003 | Cayrefourcq et al. | 385/52 |
| 6,946,732 | B2 * | 9/2005 | Akram et al. | 257/730 |
| 7,781,867 | B2 * | 8/2010 | Lee | 257/618 |

* cited by examiner

*Primary Examiner* — Roy Potter

(74) *Attorney, Agent, or Firm* — Muncy, Geissler, Olds & Lowe, PLLC

(57) ABSTRACT

Disclosed is a flip chip package maintaining alignment during soldering, primarily comprising a chip and a substrate. A plurality of bumps and at least an extruded alignment key are disposed on the active surface of the chip. The substrate has a plurality of bonding pads and at least an alignment base where the alignment base has a concaved alignment pattern corresponding to the extruded alignment key. When the chip is disposed on the substrate, the extruded alignment key is embedded into the concaved alignment pattern to achieve accurately align the bumps to the corresponding bonding pads. Therefore, even with the mechanical misalignment due to the accuracy of flip-chip die bonders and the transportation during reflow processes, the bumps of a chip still can accurately align to the bonding pads of the substrate to achieve accurate soldering which is especially beneficial to the mass production of MPS-C2 products.

9 Claims, 7 Drawing Sheets

FLIP CHIP PACKAGE MAINTAINING ALIGNMENT DURING SOLDERING

FIELD OF THE INVENTION

The present invention relates to a semiconductor device, and more particularly to a flip chip package maintaining alignment during soldering.

BACKGROUND OF THE INVENTION

The conventional packaging for semiconductor industries is to dispose a chip on a substrate, then wire bond the chip to the substrate to complete electrical connections between the two. Flip chip bonding is a more advanced packaging technology which is different from the conventional packaging method where bumps such as solder bumps or solder balls are disposed on the active surface of a chip in wafer form then the bumped chip is flipped with the active surface facing toward the substrate where the bumps become the electrical connections between the chip and the substrate to reduce the electrical path between the chip and the substrate to achieve a better electrical performance than wire bonding.

Then, IBM was the first to develop an innovated flip-chip technology where metal pillars are implemented to replace the conventional solder balls. Solder bonding materials are implemented to joint the metal pillars of a chip to the bonding pads of a substrate so that the metal pillars don't change their shapes as the conventional solder balls during reflow, therefore, the pitches between metal pillars can further be reduced below 50 um such as 30 um to achieve higher density of bump layout. In some package products, RDL (redistribution layer) on chip can be eliminated. This technology is called MPS-C2 (Metal Post Solder-Chip Connection), the related package structure is disclosed in U.S. Pat. No. 6,229,220 B1 titling "Bump Structure, Bump Forming Method and Package Connecting Body".

As shown in FIG. 1, a conventional MPS-C2 flip chip package 100 primarily comprises a chip 110 and a substrate 120. A plurality of bumps 112 such as metal pillars disposed on the active surface 111 of the chip 110 for flip-chip bonding the chip 110 to the substrate 120. The substrate 120 has a plurality of bonding pads 121 corresponding to the bumps 112. To describe in depth, the bumps 112 are bonded to the bonding pads 121 by a plurality of solder bonding materials 130 to achieve electrical connection between the chip 110 and the substrate 120. Furthermore, the flip chip package 100 further comprises an encapsulant 140 to encapsulate the bumps 112, the bonding pads 121, and the solder bonding materials 130.

Generally speaking, bumps serve as the electrical connections for fine-pitch high-density applications such as the conventional flip-chip technology including the MPS-C2 technology. Therefore, during flip-chip bonding processes, the recognition system of a flip-chip die bonder searches for two-dimensional alignment marks on a substrate for accurate alignment where high accurate alignment system is needed such as alignment tolerance under 25 um to achieve flip-chip bonding the chip 110 to the substrate 120. However, a flip-chip die bonder with high accuracy is very expensive. Moreover, even after flip-chip bonding the chip 110 to the substrate 120 with good alignment, but the following processes such as transportation of reflow processes, the vibration of the equipment, and the flooding of solder bonding materials or fluxes are easily causing the bumps 112 bonded to wrong bonding pads 121 leading to electrical failure. It is even worst for MPS-C2 technology with the drop of productivity.

SUMMARY OF THE INVENTION

The main purpose of the present invention is to provide a flip chip package maintaining alignment during soldering by three-dimensional alignment key having the positioning function for a chip even until reflow processes. Even with the mechanical misalignment due to the accuracy of flip-chip die bonders and the transportation during reflow processes, the bumps of a chip still can accurately align to the bonding pads of a substrate to achieve accurate soldering which is especially beneficial to the mass production of MPS-C2 products.

The second purpose of the present invention is to provide a flip chip package to maintain a gap between the bumps of a chip and the bonding pads of a substrate during alignment processes as well as reflow processes to avoid flooding of solder bonding materials due to compression to provide better horizontal leveling between a chip and a substrate which is especially beneficial to the reliability enhancement of MPS-C2 products.

The third purpose of the present invention is to provide a flip chip package to achieve low-temperature or room-temperature alignment between a chip and a substrate followed by reflow processes to accomplish soldering.

According to the present invention, a flip chip package maintaining alignment during soldering is revealed, primarily comprising a chip and a substrate. A plurality of bumps and at least an extruded alignment key are disposed on the active surface of the chip. The substrate has a plurality of bonding pads and at least an alignment base with a concaved alignment pattern corresponding to the extruded alignment key. When the chip is disposed on the substrate, the extruded alignment key is embedded into the concaved alignment pattern in a manner that the bumps are accurately aligned to the bonding pads.

The flip chip package maintaining alignment during soldering according to the present invention has the following advantages and functions:

1. Through the embedding combination of the extruded alignment key in the alignment base as a technical mean, the alignment base has the concaved alignment pattern corresponding to the extruded alignment key. When a chip is disposed on a substrate, the extruded alignment key is embedded into the concaved alignment pattern to make the bumps accurately align to the bonding pads. Therefore, the alignment key has the positioning function for a chip during alignment processes maintaining good alignment before or even after reflow processes. Even with the mechanical misalignment due to the accuracy of flip-chip die bonders and the transportation during reflow processes, the bumps of a chip still can accurately align to the bonding pads of a substrate to achieve accurate soldering which is especially beneficial to the mass production of MPS-C2 products.
2. Through the embedding combination of the extruded alignment key in the alignment base as a technical mean and the embedded joint height of the extruded alignment key and the alignment base is not less than the height of the bumps, a gap maintains between the bumps of a chip and the bonding pads of a substrate during alignment processes as well as reflow processes to avoid flooding of solder bonding materials due to compress to provide better horizontal leveling between the chip and the substrate which is especially beneficial to the reliability enhancement of MPS-C2 products.

3. Through the embedding combination of extruded alignment key in the alignment base as a technical mean, low-temperature or room-temperature alignment between a chip and a substrate followed by reflow processes to accomplish soldering can be achieved.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
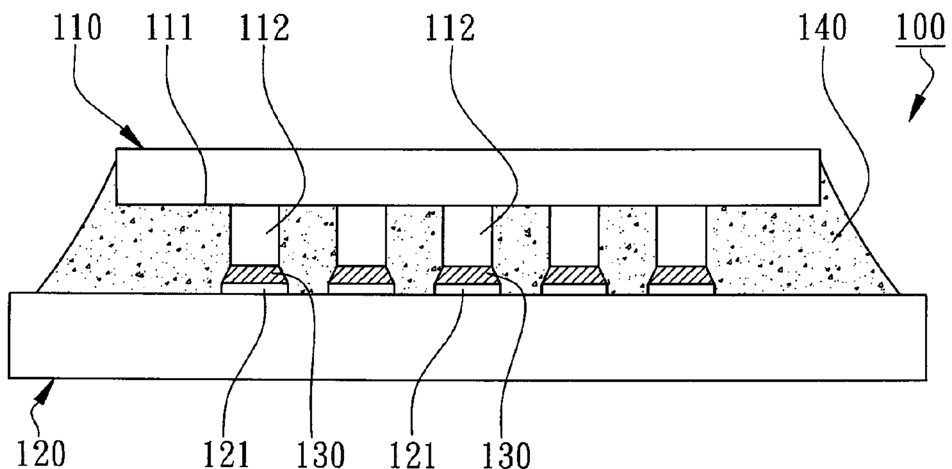
FIG. 1 is a cross-sectional view of a conventional flip chip package.
Figure 2:
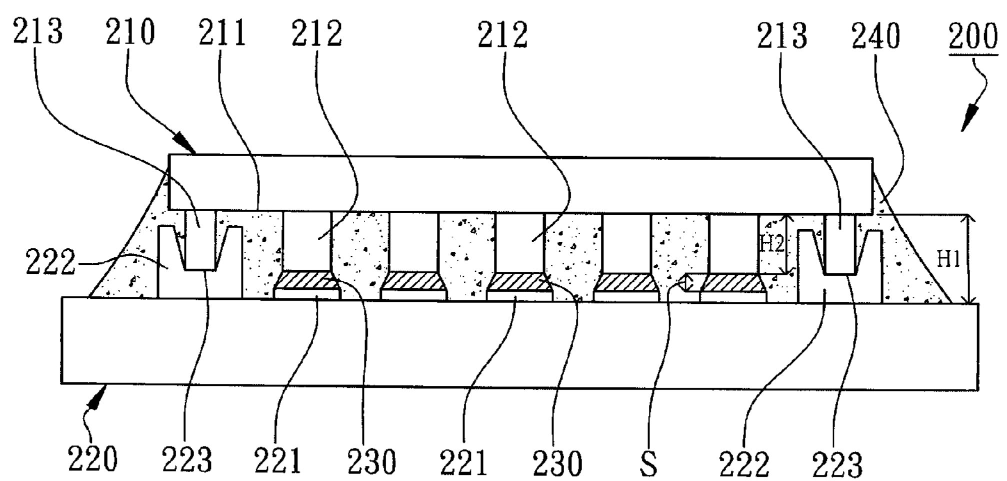
FIG. 2 is a cross-sectional view of a flip chip package maintaining alignment during soldering according to a first embodiment of the present invention.
Figure 3A:
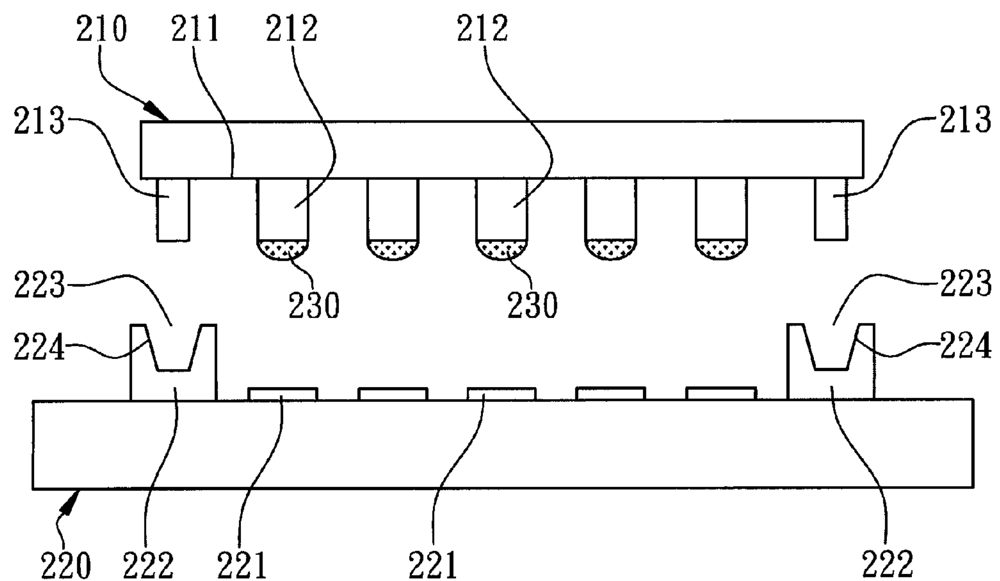
FIG. 3A to FIG. 3C are cross-sectional views illustrating the flip chip package during flip-chip bonding processes according to the first embodiment of the present invention.
Figure 3B:
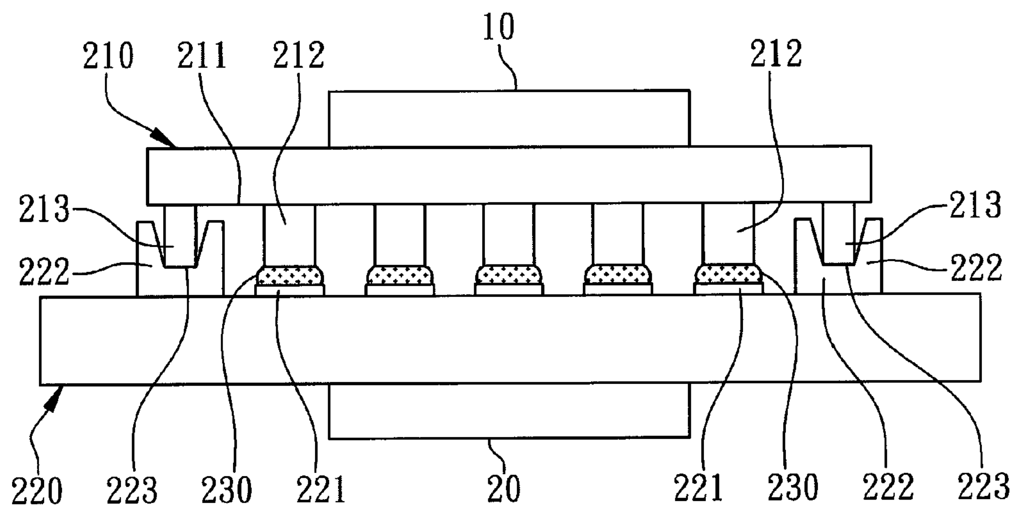
Figure 3C:
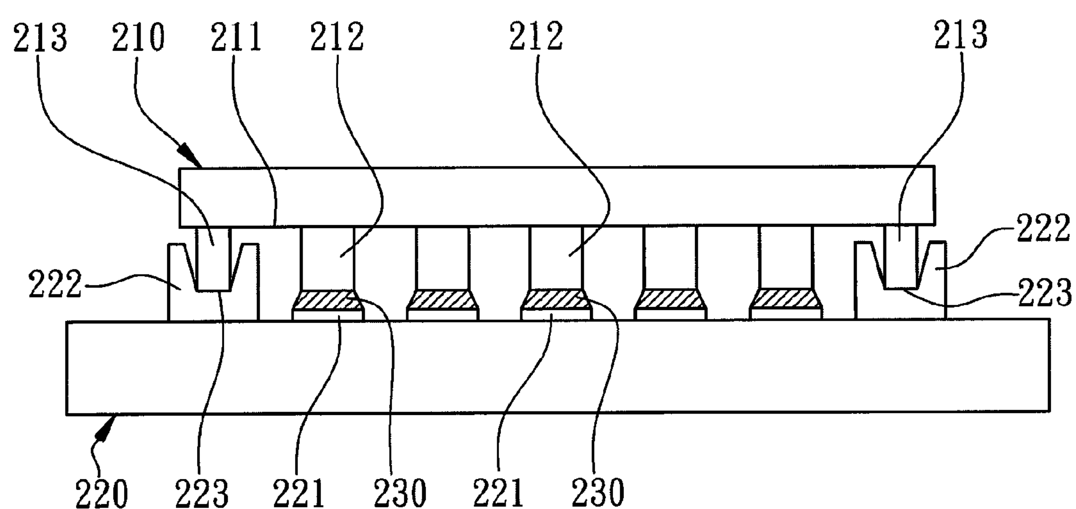
Figure 4A:
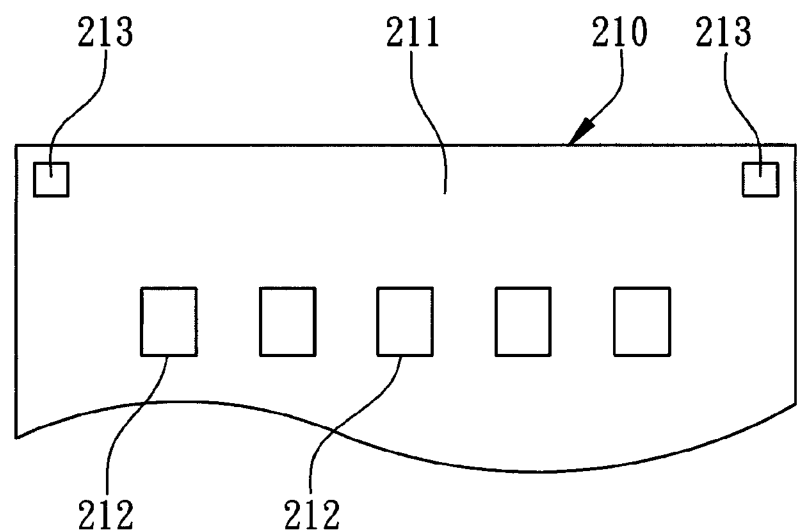
FIG. 4A and FIG. 4B are partial views of the active surface of the chip and the upper surface of the substrate in the flip chip package according to the first embodiment of the present invention.
Figure 4B:
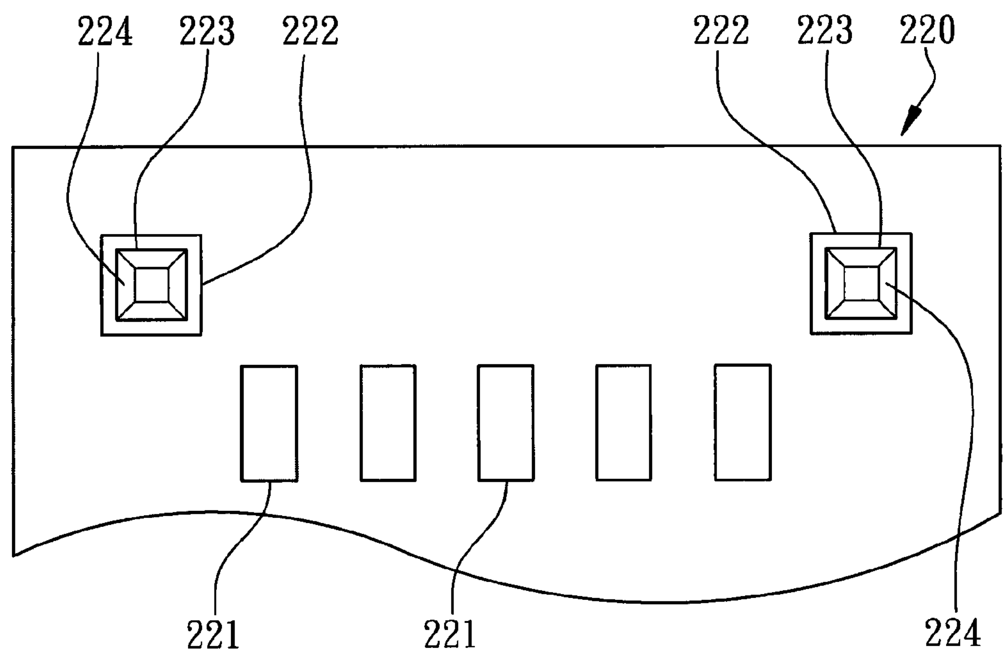

According to the first embodiment of the present invention, a flip chip package maintaining alignment during soldering is illustrated in FIG. 2 for a cross-section view, FIG. 3A to FIG. 3C for cross-sectional views of its components during flip-chip bonding processes. The flip chip package 200 primarily comprises a chip 210 and a substrate 220. FIG. 4A and FIG. 4B are partial views of the chip 210 and the substrate 220 in the package.

As shown in FIG. 2, a plurality of bumps 212 and at least an extruded alignment key 213 are disposed on an active surface 211 of the chip 210. To describe in depth, a plurality of bonding pads (not shown in the figures) are further disposed on the active surface 211 on which the bumps 212 are disposed where UBM can further be disposed between the bonding pads and the bumps 212 to avoid metal diffusion of the bumps 212. In the present embodiment, the chip 210 is a carrier for integrated circuit (IC) and is formed by singulating a wafer. The extruded alignment key 213 acts as an alignment reference point for the recognition system of a flip-chip die bonder. In the present invention, the extruded structure of the extruded alignment key 213 along with the alignment base on the substrate 220 can further enhance the holding and positioning effects against the chip 210 during alignment, transportation, and reflow processes. Preferably, the extruded alignment key 213 is plural to be symmetrically disposed at the peripheries or corners of the active surface 211 of the chip 210 relative to the dispositions of the bumps 212 without affecting the layout of the bumps 212 to achieve gap maintaining function during reflow processes. Moreover, the extruded alignment keys 213 have different flat top surfaces.

The substrate 220 has a plurality of bonding pads 221 and at least an alignment base 222 on an upper surface where the alignment base 222 has a concaved alignment pattern 223 corresponding to the extruded alignment key 213. When the chip 210 is aligned and disposed on the substrate 2120, the extruded alignment key 213 is embedded into the concaved alignment pattern 223 in a manner that the bumps 212 are accurately aligned to the bonding pads 221. To be more specific, the substrate 220 can be a printed circuit board (PCB) as the major carrier of the package and the media of electrical connection. Moreover, since a plurality of extruded alignment keys 213 are disposed on the active surface 211 and similarly a plurality of corresponding concaved alignment patterns 223 are disposed on the alignment bases 222 of the substrate 220, therefore, a mechanically fixing relationship during alignment can be built between the chip 210 and the substrate 220.

Furthermore, the flip chip package 200 further comprises a plurality of solder bonding materials 230 soldering the bumps 212 to the bonding pads 221. In a preferred embodiment, the solder bonding materials 230 is chosen from lead-free or low-temperature solder materials to meet the green regulations. Before flip-chip bonding processes, the solder bonding materials 230 are disposed on the top surfaces of the bumps 212 of the chip 210, i.e., the top surfaces of the bumps 212 away from and parallel to the active surface 211 of the chip 210. In a preferred embodiment, the bumps 212 are metal pillars without changing their shapes during reflow processes such as gold pillars, copper pillars, or high-temperature solder pillars to form MPS-C2 packages. In other words, the melting points of the bumps 212 should be higher than the reflow temperature of the solder bonding materials 230 where the solder bonding materials 230 are melted without changing the shapes of the bumps 212 and without forming balls during reflow processes.

Especially, the extruded alignment key 213 has the same height and material as the bumps 212 which is formed during electroplating to simplify process flow. In the present embodiment, the materials of the bumps 212, the extruded alignment keys 213, and the alignment bases 222 are chosen from copper where the extruded alignment key 213 is a copper post and the alignment base 222 is a copper cavity.

Preferably, as shown in FIG. 3A, the alignment base 222 has a plurality of first guiding slopes 224 inside the concaved alignment pattern 223 to enhance the guiding alignment of the extruded alignment keys 213, therefore, the extruded alignment key 213 only needs to have alignment functions without corresponding specific shapes. To be more specific, the angle of inclination of the first guiding slopes 224 ranges from 45 to 90 degrees relative to the top surfaces of the bumps 212 to enhance the extruded alignment key 213 sliding along the first guiding slope 224 to the predestined alignment position in a manner that the chip 210 can accurately align to the substrate 220. Therefore, even with flip-chip die bonders with poor alignment accuracy during flip-chip bonding processes, the extruded alignment key 213 can easily align to the alignment base 222 to achieve accurately aligning the bumps 212 to the bonding pads 221. As shown in FIG. 3C, when the extruded alignment key 213 is embedded into the concaved alignment pattern 223, i.e., the top surface of the extruded alignment key 213 completely touch the bottom surface of the concaved alignment pattern 223, therefore, the chip 210 can be accurately aligned to the substrate 220 where the alignment tolerance of the flip-chip die bonder can be enlarged.

To be more specific, the flip chip package 200 further comprises an encapsulant 240 to encapsulate the bumps 212, the bonding pads 221, and the alignment bases 222. In a preferred embodiment, the encapsulant 240 is an underfill material to avoid any voids formed between the chip 210 and the substrate 220 by using the high mobility of underfill material.

Therefore, through the specific combination of the extruded alignment key and the alignment base as a technical mean of the present invention, the extruded alignment key 213 has both functions of chip alignment and holding. Even with the mechanical misalignment due to the accuracy of flip-chip die bonders and the transportation of the chip 210 during reflow processes, the bumps 212 of the chip 210 still can accurately align to the corresponding bonding pads 221 of the substrate 220 to achieve accurate soldering which is especially beneficial to the mass production of MPS-C2 products. This is simply because the bottom surface of the concaved alignment pattern 223 of the alignment base 222 matches to the top surface of the extruded alignment key 213. When the extruded alignment key 213 is embedded in the concaved alignment pattern 223 of the alignment base 222, the vibration of the equipment or during transportation and the flooding of solder bonding materials or flux 230 do not cause position shift of the chip 210 before soldering and during reflow processes.

Furthermore, preferably, the combination height H1 of the extruded alignment key 213 embedded into the alignment base 222 is not less than the height H2 of the bumps 212 so that a gap S can be maintained between the bumps 212 of the chip 210 and the bonding pads 221 of the substrate 220, i.e., the gap S between the chip 210 and the substrate 220 is controlled by the embedding combination of the extruded alignment key 213 and the alignment base 222 to achieve horizontal leveling between the chip 210 and the substrate 220. Since the a gap S between the bumps 212 of the chip 210 and the bonding pads 221 of the substrate 220 can be maintained during alignment and reflow processes, so that the flooding of solder bonding materials 230 due to compression can be avoided providing better horizontal leveling between the chip 210 and the substrate 220.

The method of manufacturing the flip chip package 200 is also revealed in the present invention which is feasible but not limited as illustrated in FIG. 3A to FIG. 3C for cross-sectional views to clearly explain the major benefits of the present invention.

Firstly, as shown in FIG. 3A, step 1 for flip-chip bonding is to execute alignment of the chip 210 to the substrate 220 and then to thermal compress the chip. When the extruded alignment key 213 is aligned to the concaved alignment pattern 223, the bumps 212 are also aligned to the bonding pads 221. In the present step, when the chip 210 has gone through alignment processes pressing downward to the substrate 220, the first guiding slopes 224 provide guiding to enable the extruded alignment key 213 slide along the first guiding slopes 224 to overlap the bottom surface of the concaved alignment pattern 223 to achieve micro alignment. Moreover, in the present step, the solder bonding materials 230 can be disposed on the bonding pads 221 to achieve temporary bonding but without any physical soldering.

As shown in FIG. 3B, in a preferable step before soldering, the chip 210 and the substrate 220 can easily be mechanically jointed together by using a top tooling 10 to hold the chip 210 and a bottom tooling 20 to hold the substrate 220 during the transportation processes after flip-chip alignment until reflow processes. Since the extruded alignment key 213 is embedded inside the concaved alignment pattern 223, so that the chip 210 do not shift to maintain good alignment between the bumps 212 and the bonding pads 221 where the solder bonding materials 230 are still in paste form without reflowing into metal soldering interfaces.

As shown in FIG. 3C, step 2 for flip-chip bonding is the reflow processes. The solder bonding materials 230 reach reflow temperature and melt to solder to the bonding pads 221. Since the extruded alignment key 213 is embedded into the concaved alignment pattern 223 where the chip 210 does not shift by the solder bonding materials 230. Moreover, the solder bonding materials 230 are not compressed nor flooded to achieve accurately soldering. After above described reflow processes, the solder bonding materials 230 becomes solid after lowering the temperature to be soldering interfaces to firmly solder the bumps 212 to the bonding pads 221 to achieve electrical connections between the chip 210 and the substrate 220. Therefore, low-temperature or room-temperature alignment between the chip 210 and the substrate 220 followed by reflow processes to accomplish soldering can further be achieved in the present invention. Furthermore, the flip chip package 200 is not limited to the above described manufacture method which also can be achieved by reflow processes or thermal compression of the conventional flip-chip technologies.

Preferably, as shown in FIG. 4A and FIG. 4B, the extruded alignment base 213 can be disposed at one corner of the active surface 211 of the chip 210 so that the extruded alignment key 213 is further away from the central point of the active surface 211 of the chip 210 than the bumps 212 to enhance the alignment processes of the recognition system of a flip-chip die bonder with shorter time.

Furthermore, the shape of the top surface of the extruded alignment key 213 is not limited in the present invention. The extruded alignment key 213 has a flat top surface chosen from the group consisting of square, strip, triangle, or L-shape. In the present invention, no matter the shapes of the top surfaces or even with the combination of the above described shapes, the chip 210 does not shift through mechanical alignment during the transportation after alignment and before reflow, or even during reflow processes so that the chip 210 can accurately align and bond to the substrate 220.

As shown in FIG. 4A and FIG. 4B, the top surface of each bump 212 is rectangular to make the bumps 212 become cuboids. Moreover, each bonding pad 221 is a strip relative to each bump 212. In the present embodiment, the shape of the top surface of the extruded alignment key 213 is a square and the shape of the bottom surface of the corresponding concaved alignment pattern 223 is also a square. In addition, the concaved alignment pattern 223 has four first guiding slopes 224. The square mentioned in the present embodiment stands for square or rectangle to provide better alignment capability.

Figure 5A:
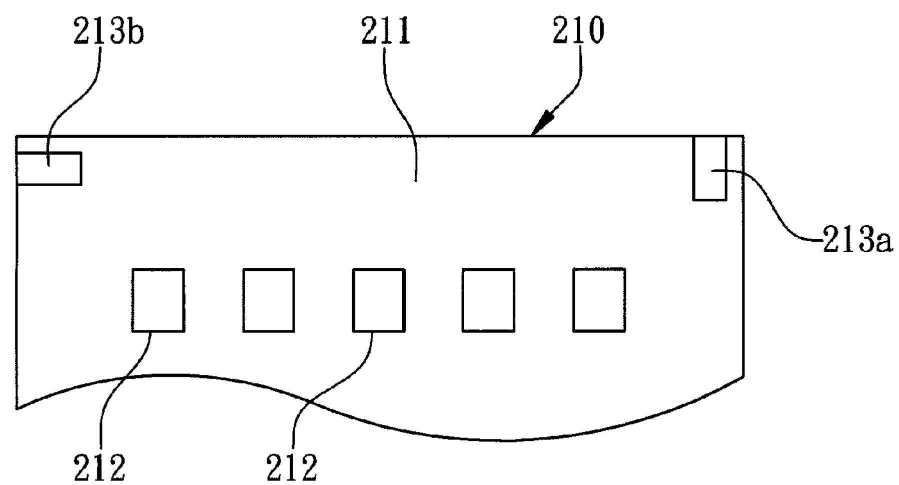
FIG. 5A and FIG. 5B are partial views of the active surface of the chip and the upper surface of the substrate in the flip chip package according to one of the variations of the first embodiment of the present invention.
Figure 5B:
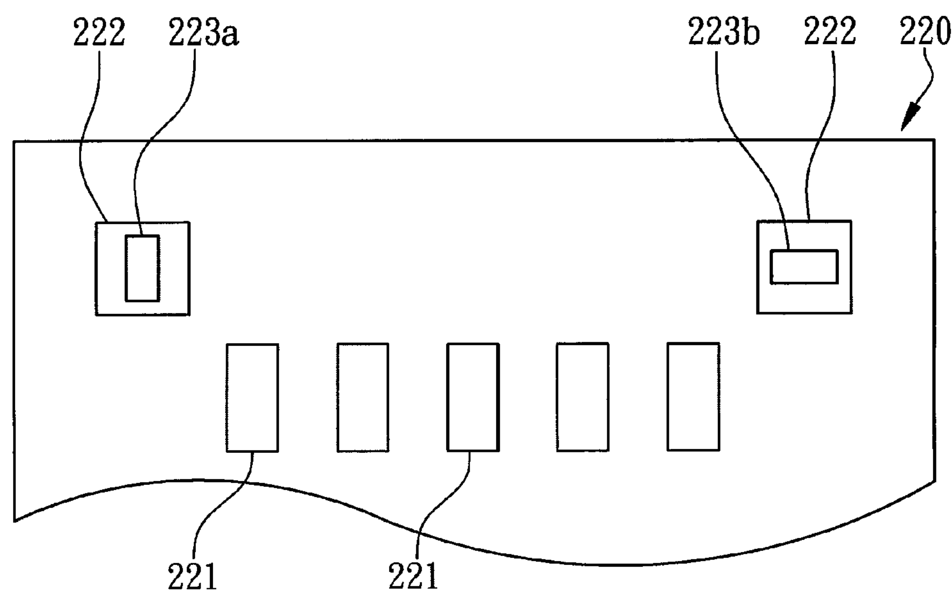

A variation embodiment is to change the shapes of the extruded alignment key and the concaved alignment pattern is shown in FIGS. 5A and 5B where the shapes of top surfaces of the extruded alignment keys 213*a*, 231*b* are strips and the shapes of bottom surfaces of the concaved alignment patterns 223*a*, 223*b* are also strips. The above mentioned "strip"

stands for a shape with two sets of corresponding parallel sides where the lengths of the adjacent sides are not the same. To describe in detail, the extruded alignment key 213*a* and 213*b* can be disposed in different directions where the longer sides of the extruded alignment key 213*a* are perpendicular to the longer sides of the extruded alignment key 213*b* disposed on the other corner. Moreover, as shown in FIG. 5B, the concaved alignment pattern 223*a* and 223*b* are disposed at the corners corresponding to the extruded alignment key 213*a* and 213*b* after flipping the chip 210. Therefore, when flipping the chip 210 for alignment, the extruded alignment key 213*a* is embedded into the concaved alignment pattern 223*a* and the extruded alignment key 213*b* is embedded into the concaved alignment pattern 223*b* without considering the alignment direction of the chip 210 to the substrate 220 to easily achieve accurately alignment through the extruded alignment key 213 and the concaved alignment base 222.

Figure 6A:
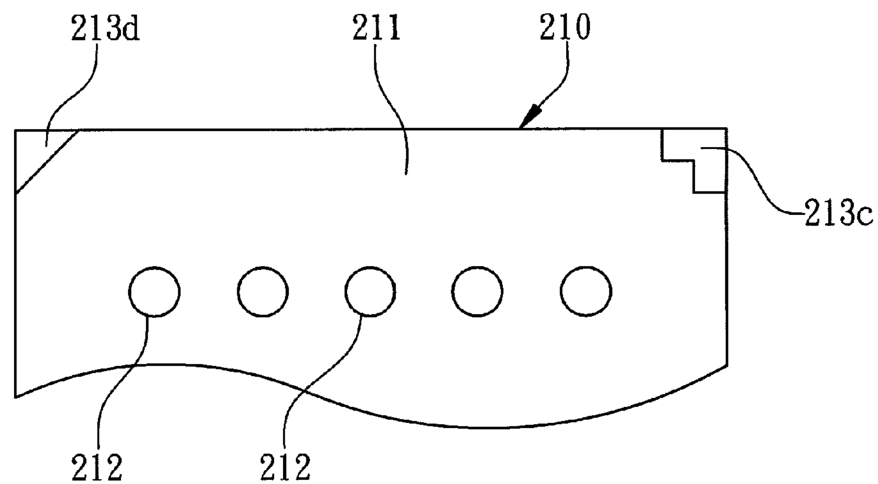
FIG. 6A and FIG. 6B are partial views of the active surface of the chip and the upper surface of the substrate in the flip chip package according to another variation of the first embodiment of the present invention.
Figure 6B:
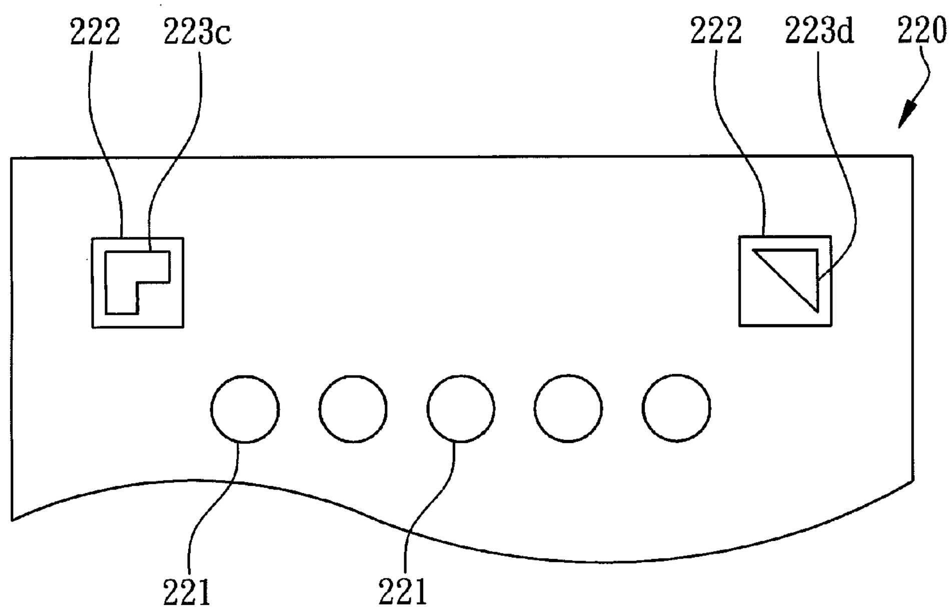

As shown in FIG. 6A and FIG. 6B, the top surface of each bump 212 is circular to form a cylinder where each bonding pad 221 is also circular to provide flip-chip bonding of the corresponding bump 212. In a variation embodiment, the top surface of the extruded alignment key 213 can be a triangle and an L-shape. To be more specific, as shown in FIG. 6A, the top surface of the extruded alignment key 213*c* is L-shape disposed at the top right corner of the active surface 211 of the chip 210 where the top surface of the extruded alignment key 213*d* is a triangle disposed on the top left corner of the active surface 211 of the chip 210. As shown in FIG. 6B, the L-shape of the concaved alignment pattern 223*c* is disposed on the left and the triangle of the concaved alignment pattern 223*d* is disposed on the right. When flipping the chip 210 for flip-chip alignment, the extruded alignment key 213*c* is embedded into the concaved alignment pattern 223*c* and the extruded alignment key 213*d* is embedded into the concaved alignment pattern 223*d*.

Figure 7:
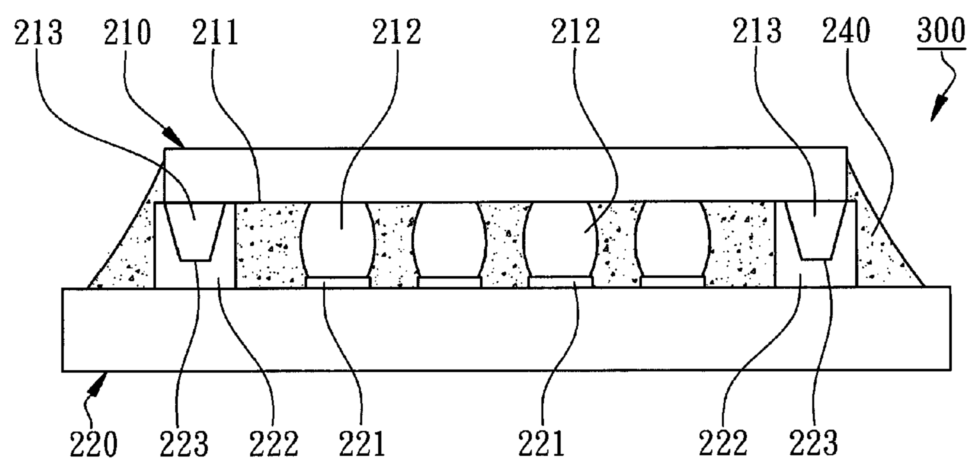
FIG. 7 is a cross-sectional view of another flip chip package maintaining alignment during soldering according to a second embodiment of the present invention.
Figure 8:
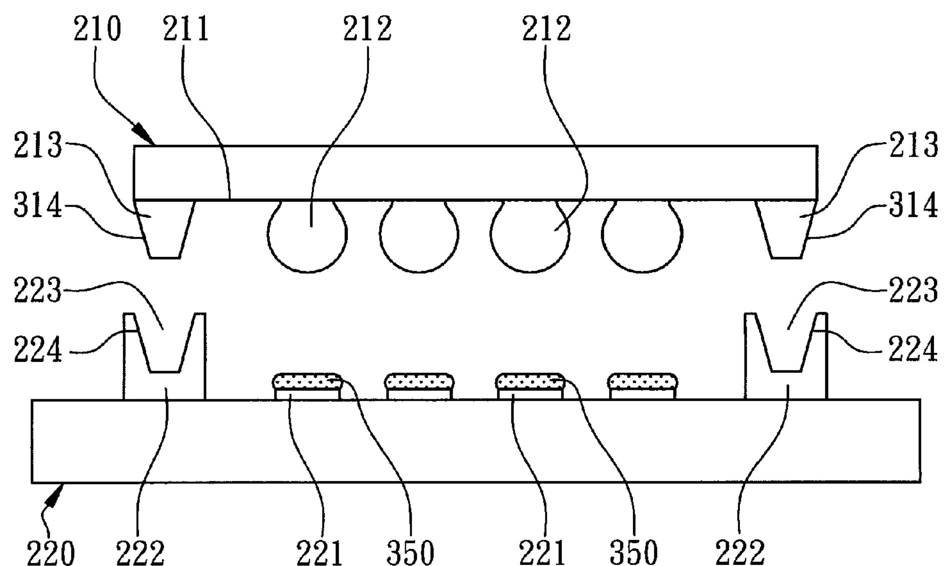
FIG. 8 is a cross-sectional view of the flip chip package during alignment of flip-chip bonding processes according to the second embodiment of the present invention.

In the second embodiment of the present invention, another flip chip package maintaining alignment during soldering is illustrated in FIG. 7 for a cross-sectional view and in FIG. 8 for a cross-sectional view during alignment of flip-chip bonding processes. The major components and the corresponding numbers are the same as in the first embodiment which will not be described in detail again.

The present invention can be implemented not only to the products of MPS-C2 but also to conventional flip chip packages with solder balls. As shown in FIG. 7, the flip chip package 300 primarily comprises a chip 210 and a substrate 220. A plurality of bumps 212 and at least an extruded alignment key 213 are disposed on the active surface 211 of the chip 210. A plurality of bonding pads 221 and at least an alignment base 222 are disposed on the substrate 220 where the alignment base 222 has a concaved alignment pattern 223 corresponding to the extruded alignment key 213. When the chip 210 is aligned to and disposed on the substrate 220, the extruded alignment key 213 is embedded into the concaved alignment pattern 223. In the present embodiment, the bumps 212 are chosen from the group consisting of solder bumps and solder balls where the chip 210 is electrically connected to the substrate 220 through soldering the bumps 212 to the bonding pads 221.

As shown in FIG. 8, in the present embodiment, during the alignment processes of flip-chip bonding, a plurality of solder bonding materials 350 can be pre-applied on the bonding pads 221 so that the bumps 212 can touch and adhere to the solder bonding materials 350 disposed on the bonding pads 221 where the bumps 212 are melt into solder balls during reflow then soldering to the bonding pads 221.

In a preferred embodiment, the concaved alignment pattern 223 is a half-cone concaved cavity to have four first guiding slopes 224 where the extruded alignment key 213 has a plurality of second guiding slopes 314 so that the extruded alignment key 213 has a cross-section of a half cone to completely fill into the concaved alignment pattern 223 as shown in FIG. 7. Therefore, the shapes of the extruded alignment key 213 and the concaved alignment pattern 223 are completely matched each other. Moreover, through the inclined design of the second guiding slopes 314 and the first guiding slopes 224, the extruded alignment key 213 can easily slide into the concaved alignment pattern 223. Therefore, the chip 213 can be self-aligned and firmly held without any shifting during the thermal compression of flip-chip bonding (before reflow). Moreover, since there is no large gap inside the concaved alignment pattern 223, there is no need for underfilling in the concaved alignment pattern 223.

The extruded alignment key 213 automatically slide into the alignment base 222 to achieve self-alignment. During the reflow processes and the transportation before reflow, the extruded alignment key 213 is embedded in the concaved alignment pattern 223 of the alignment base 222 to position the chip 210 without shifting. The bumps 212 can be accurately soldering to the bonding pads 221 to avoid electrical short due to bridging of solder balls. Furthermore, through the embedding combination of the extruded alignment key 213 in the alignment base 222, the chip 210 and the substrate 220 can maintain a gap with good leveling during alignment, transportation and reflow processes to avoid damage of the bumps 212 due to compression or tension to achieve better product reliability.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A flip chip package comprising:

a chip with a plurality of bumps and at least an extruded alignment key disposed on an active surface of the chip;

a substrate having a plurality of bonding pads and at least an alignment base where the alignment base has a concaved alignment pattern corresponding to the extruded alignment key;

when the chip is disposed on the substrate, the extruded alignment key is embedded into the concaved alignment pattern in a manner that the bumps are accurately aligned to the bonding pads; and a plurality of solder bonding materials soldering the bumps to the corresponding bonding pads;

wherein the bumps are metal pillars without changing their shapes during reflow processes to form a MPS-C2 package;

wherein the combination height of the extruded alignment key embedded into the alignment base is not less than the height of the bumps so that a gap is maintained between the bumps of the chip and the bonding pads of the substrate;

wherein the alignment base is a protrusive component disposed on the substrate.

2. The flip chip package as claimed in claim 1, wherein the alignment base has a plurality of first guiding slopes inside the concaved alignment pattern to enhance the guiding alignment of the extruded alignment key.

3. The flip chip package as claimed in claim 2, wherein the concaved alignment pattern is a half-cone concaved cavity where the extruded alignment key has a plurality of second guiding slopes corresponding to the first guiding slopes so that the extruded alignment key have a cross-section of a half cone to completely fill into the concaved alignment pattern.

4. The flip chip package as claimed in claim 1, wherein the extruded alignment key is located at a corner of the active surface of the chip.

5. The flip chip package as claimed in claim 1, wherein the extruded alignment key is plural to be symmetrically disposed on the peripheries of the active surface of the chip relative to the dispositions of the bumps.

6. The flip chip package as claimed in claim 5, wherein the extruded alignment keys have different flat top surfaces.

7. The flip chip package as claimed in claim 1, wherein the extruded alignment key has a flat top surface chosen from the group consisting of square, strip, triangle, and L-shape.

8. The flip chip package as claimed in claim 1, wherein the extruded alignment key has the same height and material as the bumps.

9. The flip chip package as claimed in claim 1, wherein the materials of the bumps, the extruded alignment key, and the alignment base are the same, wherein the extruded alignment key is a copper post and the alignment base is a copper cavity component.

* * * * *